United States Patent
Jeon et al.

(10) Patent No.: US 7,978,117 B2
(45) Date of Patent: *Jul. 12, 2011

(54) MULTI-STAGE DUAL SUCCESSIVE APPROXIMATION REGISTER ANALOG-TO-DIGITAL CONVERTOR AND METHOD OF PERFORMING ANALOG-TO-DIGITAL CONVERSION USING THE SAME

(75) Inventors: Young Deuk Jeon, Daejeon (KR); Young Kyun Cho, Daejeon (KR); Jae Won Nam, Daejeon (KR); Jong Kee Kwon, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 7 days.

This patent is subject to a terminal disclaimer.

(21) Appl. No.: 12/539,406

(22) Filed: Aug. 11, 2009

(65) Prior Publication Data

US 2010/0156692 A1    Jun. 24, 2010

(30) Foreign Application Priority Data

Dec. 22, 2008   (KR) .................. 10-2008-0131583

(51) Int. Cl.
*H03M 1/34*    (2006.01)
(52) U.S. Cl. ....................................... 341/163; 341/155

(58) Field of Classification Search .................. 341/155, 341/144, 163, 172
See application file for complete search history.

(56) References Cited

U.S. PATENT DOCUMENTS 6,124,818 A * 9/2000 Thomas et al. ............... 341/155
6,879,277 B1 * 4/2005 Cai ............................... 341/155

FOREIGN PATENT DOCUMENTS

KR   10-1997-0013785   3/1997

OTHER PUBLICATIONS

Simone M. Louwsma et al., "A 1.35 GS/s, 10b, 175 mW Time-Interleaved AD Converter in 0.13μm CMOS," Symposium on VLSI Circuits Digest of Technical Papers, pp. 62-63, 2007.

* cited by examiner

Primary Examiner — Peguy JeanPierre

(57) ABSTRACT

A multi-stage dual successive approximation register analog-to-digital converter (SAR ADC) and a method of performing analog-to-digital conversion using the same are provided. The multi-stage dual SAR ADC includes: a plurality of SAR ADC stages for converting an analog input voltage into a predetermined bit digital signal, each SAR ADC stage being serially connected to one another and including two SAR ADCs; and at least one residue amplifier respectively connected between every two successive SAR ADC stages, amplifying residue voltage output from a previous SAR ADC stage to output the amplified residue voltage to a next SAR ADC stage. The two SAR ADCs of the previous SAR ADC stage share the residue amplifier.

13 Claims, 4 Drawing Sheets

MULTI-STAGE DUAL SUCCESSIVE APPROXIMATION REGISTER ANALOG-TO-DIGITAL CONVERTOR AND METHOD OF PERFORMING ANALOG-TO-DIGITAL CONVERSION USING THE SAME

CROSS-REFERENCE TO RELATED APPLICATION

This application claims priority to and the benefit of Korean Patent Application No. 10-2008-0131583, filed Dec. 22, 2008, the disclosure of which is incorporated herein by reference in its entirety.

BACKGROUND

1. Field of the Invention

The present invention relates to an analog-to-digital converter. More specifically, the present invention relates to a multi-stage dual successive approximation register analog-to-digital converter (SAR ADC), which implements one SAR ADC stage using two SAR ADCs for a high-speed analog-to-digital conversion, and a method of performing analog-to-digital conversion using the same.

2. Discussion of Related Art

Analog-to-digital converters (ADCs) convert continuous analog signals into discrete digital signals that represent the magnitude of the continuous signals. Examples of ADCs include a pipeline ADC, a successive approximation register (SAR) ADC, an algorithmic ADC, and so on.

The SAR ADC has a simple structure in which one comparator is repeatedly used. It is power and space-efficient and can be easily applied to low-power circuit, because it does not require an analog circuit using an amplifier such as a sample-and-hold amplifier (SHA). The SAR ADC, however, has a structure that repeatedly uses the same circuit, so that its operating speed is limited to about tens of MHz.

For this reason, most conventional high-speed, high-resolution ADCs have been implemented using a pipeline ADC.

FIG. 1 is a schematic view illustrating the structure of a conventional pipeline ADC.

Referring to FIG. 1, the conventional pipeline ADC includes an SHA 110 sampling/holding an original analog input voltage Vin, sub-ranging ADCs 120a and 120b, a flash ADC 130, and a digital correction circuit 140.

In this conventional pipeline ADC, the sub-ranging ADCs 120a and 120b sequentially perform digital conversion on the analog input voltage Vin, and the flash ADC 130 performs digital conversion on a last bit (a least significant bit (LSB)). Digital conversion resolution of the final analog input voltage Vin is equal to the sum of resolutions of the sub-ranging ADCs 120a and 120b and the flash ADC 130.

Here, each of the sub-ranging ADCs 120a and 120b includes a multiplying digital-to-analog converter (MDAC) block, which has an SHA 121, an adder 123, an amplifier 125, and a digital-to-analog converter (DAC) 127, and a flash ADC 129.

As for operation of the sub-ranging ADCs 120a or 120b, when an analog signal is input from a preceding stage, a part of the analog signal is converted into a digital signal by the flash ADC 129, and then the converted digital signal is again converted into an analog signal by the DAC 127.

Afterwards, the analog signal sampled by the SHA 121 and the analog signal converted again by the DAC 127 are added by the adder 123, and the added analog signal is amplified by the amplifier 125 and output to the following stage.

As such, the pipeline ADC includes the sub-ranging ADCs 120a and 120b, each of which converts a part of the input signal into digital. Thus, the pipeline ADC allows relatively fast digital-to-analog conversion with high resolution.

However, since the SHA 110 is located at the input stage, noise and nonlinear characteristics generated by the capacitor and amplifier affect the entire ADC, deteriorating its performance. Further, the number of comparators used by the flash ADC 129 increases by a power of two as required resolution increases. Thus, if a flash ADC with three or more bits is used, area greatly increases.

SUMMARY OF THE INVENTION

The present invention is directed to a multi-stage dual successive approximation register analog-to-digital converter (SAR ADC) capable of reducing a chip area and power consumption, while maintaining a high operating speed, and a method of performing analog-to-digital conversion using the same.

One aspect of the present invention provides a multi-stage dual SAR ADC including: a plurality of SAR ADC stages for converting an analog input voltage into a predetermined bit digital signal, each SAR ADC stage being serially connected to one another and including two SAR ADCs; and at least one residue amplifier respectively connected between every two successive SAR ADC stages, amplifying residue voltage output from a previous SAR ADC stage to output the amplified residue voltage to a next SAR ADC stage. The two SAR ADCs of the previous SAR ADC stage share the residue amplifier.

Another aspect of the present invention provides a method of performing analog-to-digital conversion using a multi-stage dual SAR ADC including a plurality of SAR ADC stages that are sequentially connected to one another for converting an analog input voltage into a predetermined bit digital signal, each of the SAR ADC stages including two SAR ADCs connected in parallel; and at least one residue amplifier respectively connected between every two successive SAR ADC stages, the method comprising: independently performing analog-to-digital conversion, by the two SAR ADCs in each SAR ADC stage, during different clock cycles; and amplifying, by the residue amplifier, residue voltages output from the two SAR ADCs after the analog-to-digital conversion.

BRIEF DESCRIPTION OF THE DRAWINGS

The above and other objects, features and advantages of the present invention will become more apparent to those of ordinary skill in the art by describing in detail exemplary embodiments thereof with reference to the attached drawings in which.

DETAILED DESCRIPTION OF EXEMPLARY EMBODIMENTS

The present invention will be described more fully hereinafter with reference to the accompanying drawings, in which exemplary embodiments of the invention are shown. This invention may, however, be embodied in different forms and should not be construed as limited to the exemplary embodiments set forth herein. It should be noted that the same reference numbers are used in the figures to denote the same elements. Matters described herein, such as detailed construction and elements, are intended to enable a comprehensive understanding of exemplary embodiments of the invention. Detailed description of known functions and components will be omitted when deemed that such description would detract from the clarity and concision of the disclosure of the present invention.

The present invention suggests a multi-stage dual successive approximation register analog-to-digital converter (SAR ADC) capable of operating at a speed similar to a pipeline ADC while minimizing chip area and power consumption.

To aid in understanding the present invention, a multi-stage SAR ADC will be described first, followed by the multi-stage dual SAR ADC.

Figure 1:
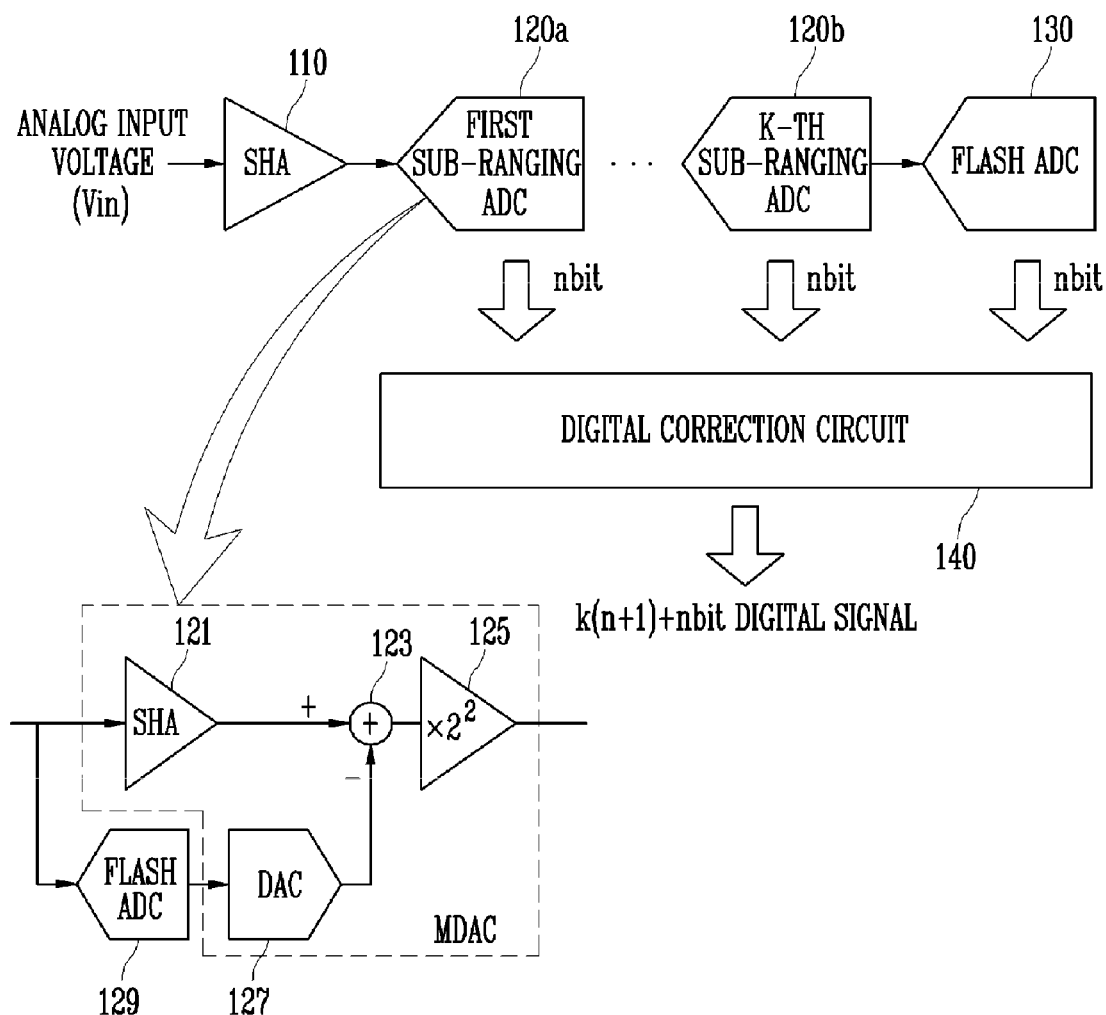
FIG. 1 is a schematic view illustrating the structure of a conventional pipeline analog-to-digital converter (ADC)
Figure 2:
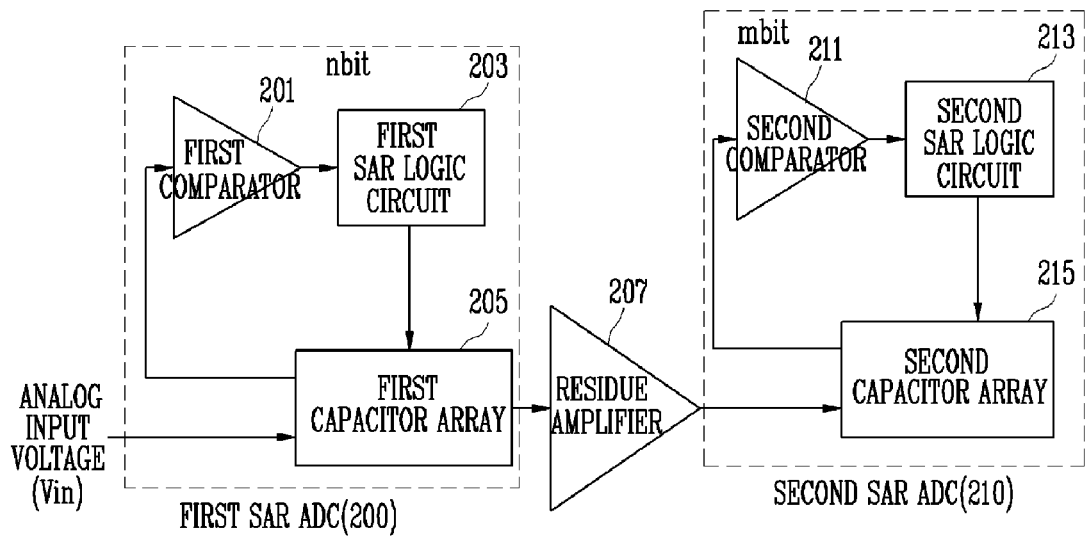
FIG. 2 illustrates the structure of a multi-stage successive approximation register (SAR) ADC.

FIG. 2 illustrates the structure of a multi-stage SAR ADC. As illustrated in FIG. 2, the multi-stage SAR ADC includes a first SAR ADC stage 200 and a second SAR ADC stage 210. A residue amplifier 207 is connected between the first SAR ADC stage 200 and the second SAR ADC stage 210. The first SAR ADC stage 200 includes a first comparator 201, a first SAR logic circuit 203, and a first capacitor array 205, and the second SAR ADC stage 210 includes a second comparator 211, a second SAR logic circuit 213, and a second capacitor array 215.

In the first or second SAR ADC stage, the comparator 201 or 211 compares level voltage previously generated by the capacitor array 205 or 215 with analog input voltage Vin, thereby generating a high- or low-level signal. The SAR logic circuit 203 or 213 converts the analog input voltage Vin into a digital signal using the high- or low-level signal generated by the comparator 201 or 211. The capacitor array 205 or 215 includes multiple switched capacitors (not shown), and generates the level voltage. The level voltage is for appropriately splitting reference voltage Vref according to digital resolution of the ADC, and comparing it with the analog input voltage Vin.

In this multi-stage SAR ADC, the residue amplifier 207 is connected between the first SAR ADC stage 200 and the second SAR ADC stage 210, and amplifies residue voltage output from the first SAR ADC stage 200.

As for the operation of the multi-stage SAR ADC, when the analog input voltage Vin is input, the first SAR ADC stage 200 performs n-bit digital conversion. Then, the residue amplifier 207 amplifies the residue voltage after the n-bit digital conversion, and the second SAR ADC stage 210 performs m-bit digital conversion on the amplified residue voltage. The second SAR ADC stage 210 operates the same as the first SAR ADC stage 200. The second SAR ADC stage 210 is the last stage and thus is not required to amplify the signal and pass it to the next stage. Thus, the last stage SAR ADC has twice as long an operating period as the previous stage SAR ADC.

Consequently, the analog input voltage Vin is subjected to (n+m)-bit digital conversion while passing through the first and second SAR ADC stages 200 and 210.

The two-stage SAR ADC needs a similar amount of time to the conventional SAR ADC with n+m bit resolution to perform the (n+m)-bit digital conversion on one analog input voltage Vin. However, when several analog input voltages are continuously input in sequence into the two-stage SAR ADC, the second SAR ADC stage 210 performs the m-bit digital conversion on a first analog input voltage, while the first SAR ADC stage 200 performs the n-bit digital conversion on a second analog input voltage. Thus, an entire amount of time required for the digital conversion can be remarkably reduced. Although the multi-stage SAR ADC is composed of two SAR ADC stages in FIG. 2, it may be composed of more than two SAR ADC stages. In this case, the multi-stage SAR ADC can have a faster operating speed.

Figure 3:
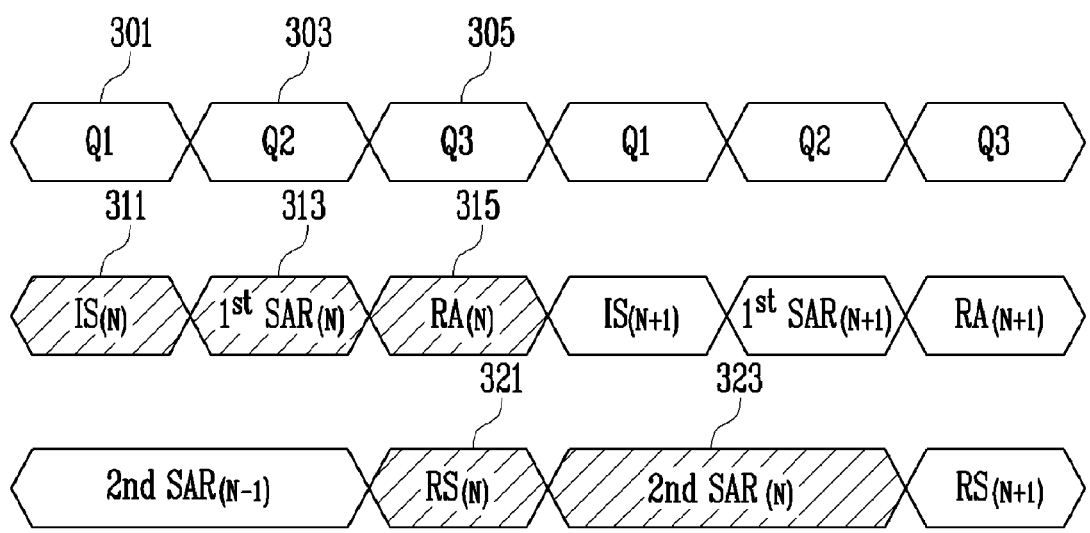
FIG. 3 is a timing diagram of the multi-stage SAR ADC illustrated in FIG. 2.

FIG. 3 is a timing diagram of the multi-stage SAR ADC illustrated in FIG. 2. Referring to FIG. 3, operation of the multi-stage SAR ADC is controlled on the basis of a clock signal. The multi-stage SAR ADC illustrated in FIG. 2 operates with three clocks, i.e. Q1, Q2 and Q3 clocks 301, 302 and 303 with different phases.

The first SAR ADC stage 200 samples an n-th analog signal during Q1 clock 301 (311), performs analog-to-digital conversion during Q2 clock cycle 303 (313), and performs no specific operation during Q3 clock 305.

The residue amplifier 207 does not operate during Q1 and Q2 clocks 301 and 303, but amplifies residue voltage output from the first SAR ADC stage 200 during Q3 clock 305 (315).

The second SAR ADC stage 210 performs digital conversion on an (n−1)-th analog signal during Q1 and Q2 clocks 301 and 303 (321), and samples the residue voltage to which the n-th analog signal is amplified and output by the residue amplifier 207 during Q3 clock 305 (323).

This operation is repeated every three clock cycles. Thus, when a series of analog input voltages, for instance, (n−1)-th, n-th and (n+1)-th analog input voltages, are input in sequence, the second SAR ADC stage 210 performs analog-to-digital conversion on the (n−1)-th analog input voltage, and simultaneously the first SAR ADC stage 200 performs analog-to-digital conversion on the n-th analog input voltage.

The above-described multi-stage SAR ADC processes the analog input signals in parts to improve operating speed compared to an ordinary SAR ADC, but it has a slightly lower operating speed than the pipeline ADC. This is because the multi-stage SAR ADC operates with three phases, namely sampling, SAR, and amplification, while the pipeline ADC operates with two phases, namely sampling and amplification.

For this reason, the present invention proposes the multi-stage dual SAR ADC, in which two SAR ADCs are allocated to each stage of the multi-stage SAR ADC, and in which analog input voltages are processed in parallel in each stage of the multi-stage SAR ADC.

Figure 4:
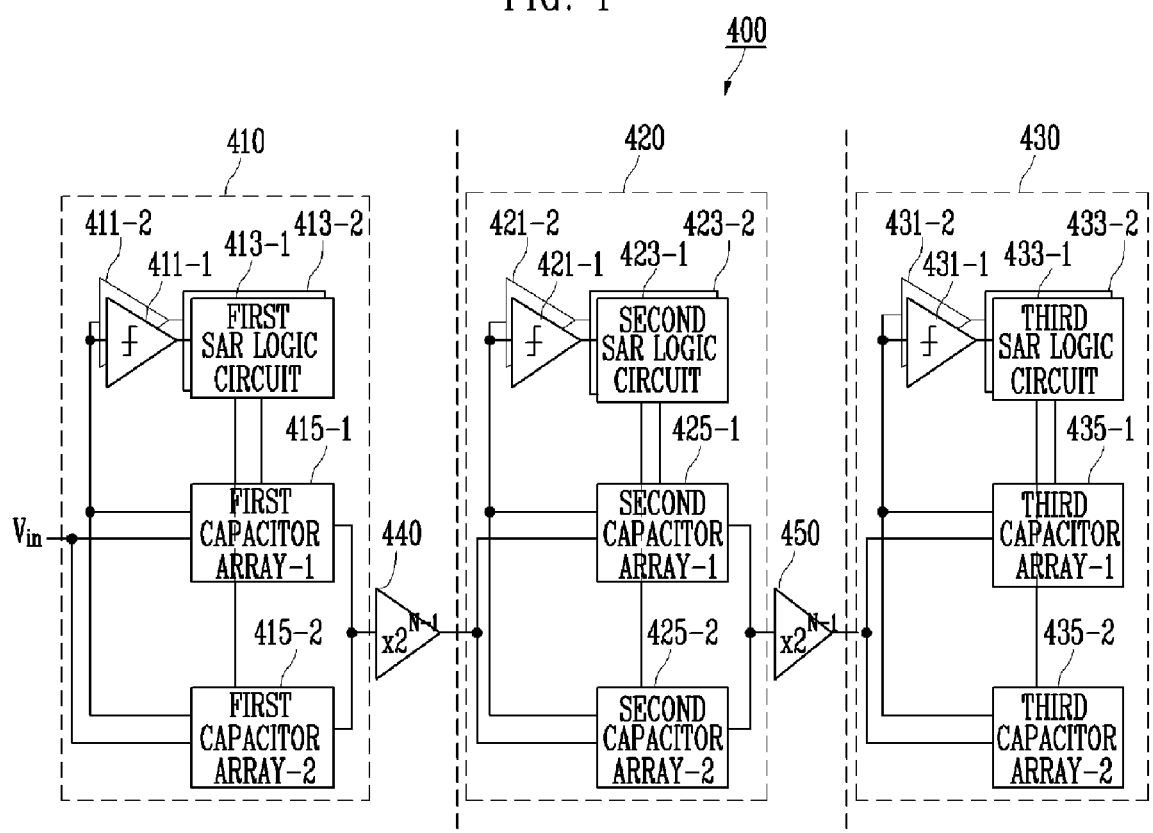
FIG. 4 illustrates a multi-stage dual SAR ADC according to an exemplary embodiment of the present invention.

FIG. 4 illustrates a multi-stage dual SAR ADC 400, and more particularly, a three-stage dual SAR ADC, according to an exemplary embodiment of the present invention.

Referring to FIG. 4, the multi-stage dual SAR ADC 400 has three SAR ADC stages including first and second SAR ADC stages 410 and 420 converting an analog input voltage Vin into an n-bit digital signal, and a third SAR ADC stage 430 converting the analog input voltage Vin into an m-bit digital signal, and first and second residue amplifiers 440 and 450 respectively connected between the first and second SAR ADC stages 410 and 420 and between the second and third SAR ADC stages 420 and 430 and amplifying output voltages of the first and second SAR ADC stages 410 and 420.

Each of the SAR ADC stages 410, 420 and 430 is configured such that two SAR ADCs are connected in parallel to receive and independently process the analog input voltage Vin. For example, the first SAR ADC stage 410 includes two SAR ADCs, one of which has a comparator 411-1, an SAR logic circuit 413-1, and a first capacitor array-1 415-1, and the other of which has a comparator 411-2, an SAR logic circuit 413-2, and a first capacitor array-2 415-2. Here, the capacitor array generates bit level voltages according to a predetermined bit. The comparator compares the analog input voltage with the bit level voltages. The SAR logic circuit performs digital conversion on the analog input voltage with a predetermined bit using the results of comparison by the comparator. This configuration is equally applied to the second and third SAR ADC stages 420 and 430, as illustrated in FIG. 4. The two SAR ADCs of the SAR ADC stages require four clocks with different phases in order to process the analog signal in parallel.

The two SAR ADCs of the SAR ADC stages share the residue amplifiers connected between the SAR ADC stages. In detail, the two SAR ADCs of the first SAR ADC stage 410 share the first residue amplifier 440, and the two SAR ADCs of the second SAR ADC stage 420 share the second residue amplifier 450. Thereby, a chip area can be reduced. The reason why the two SAR ADCs of each SAR ADC stage can share a residue amplifier is that timings of the two SAR ADCs using the residue amplifier are different from each other. This will be described in more detail below with reference to the timing diagram of FIG. 5.

Figure 5:
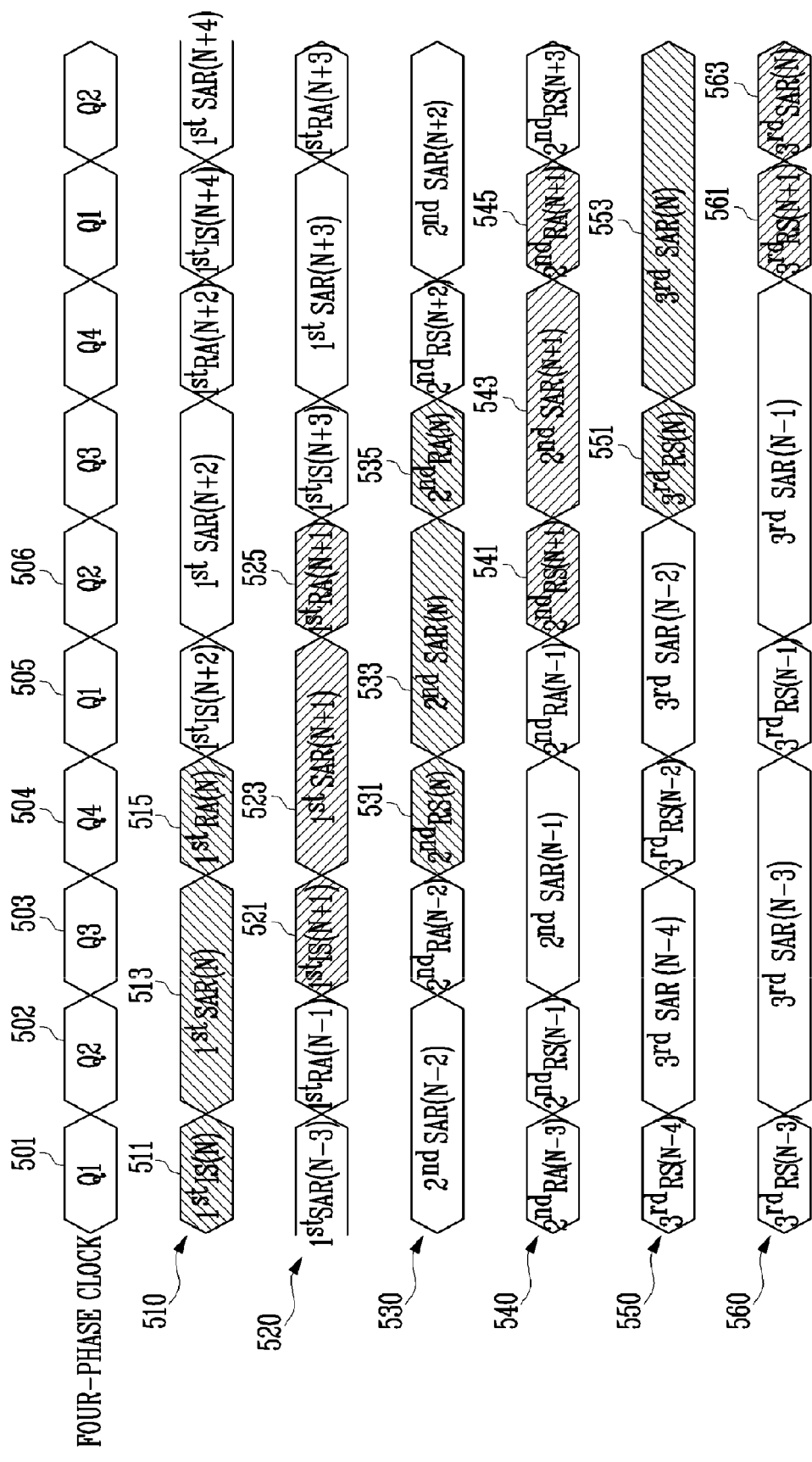
FIG. 5 is a timing diagram of the multi-stage dual SAR ADC illustrated in FIG. 4.

FIG. 5 is a timing diagram of the multi-stage dual SAR ADC 400 illustrated in FIG. 4. The multi-stage dual SAR ADC 400 illustrated in FIG. 4 requires four clock cycles Q1, Q2, Q3 and Q4 with different phases to operate. Among lines shown in the timing diagram of FIG. 5, a line 510 is for operation timing of the first SAR ADC (the first SAR ADC1) of the first SAR ADC stage; a line 520 is for operation timing of the second SAR ADC (the first SAR ADC2) of the first SAR ADC stage; a line 530 is for operation timing of the first SAR ADC (the second SAR ADC1) of the second SAR ADC stage; a line 540 is for operation timing of the second SAR ADC (the second SAR ADC2) of the second SAR ADC stage; a line 550 is for operation timing of the third SAR ADC (the third SAR ADC1) of the third SAR ADC stage; and a line 560 is for operation timing of the third SAR ADC (the third SAR ADC2) of the third SAR ADC stage.

First, as shown in the line 510, the first SAR ADC1 samples an n-th analog signal during Q1 clock cycle 501 (511), performs analog-to-digital conversion during Q2 and Q3 clock cycles 502 and 503 (513), and performs no specific operation during Q4 clock cycle 504. Meanwhile, the first residue amplifier 440 does not operate during Q1, Q2 and Q3 clock cycles 501, 502 and 503, but amplifies residue voltage output from the first SAR ADC1 during Q4 clock cycle 504 (515).

Next, as shown in the line 520, the first SAR ADC2 independently performs the same operation as the first SAR ADC1 at different clock period. In detail, the first SAR ADC2 samples an (n+1)-th analog signal during Q3 clock cycle 503 (521), performs analog-to-digital conversion during Q4 and Q1 clock cycles 504 and 505 (523), and performs no specific operation during Q2 clock cycle 506. In contrast, the first residue amplifier 440 does not operate during Q3, Q4 and Q1 clock cycles 503, 504 and 505, but amplifies residue voltage output from the first SAR ADC2 during Q2 clock cycle 506 (525). This operation is equally applied to the second and third SAR ADC stages.

Referring to FIG. 5, among the two SAR ADCs of the first SAR ADC stage, the first SAR ADC1 operates during clock cycles 501 through 504 (511, 513 and 515), while the first SAR ADC2 operates during clock cycles 503 through 506 (521, 523 and 525). Thus, it can be found that the two SAR ADCs independently perform the signal conversion with a phase difference of 180°. Since the first SAR ADC1 and the first SAR ADC2 use the residue amplifier during different clock cycles, they share the residue amplifier. Thereby, the residue voltage of the first SAR ADC1 can be amplified during Q4 clock cycle, and the residue voltage of the first SAR ADC2 can be amplified during Q2 clock cycle. This operation is equally applied to the second SAR ADC stage, except for the phase difference. Since the last SAR ADC stage does not need to perform amplification, it is possible to reduce operating time of the multi-stage dual SAR ADC.

Consequently, it can be found that the SAR ADCs of the first SAR ADC stage 410 perform the sampling during Q1 and Q3 clock cycles 501 and 503, and the residue voltage amplification during Q2 and Q4 clock cycles 502 and 504. In other words, the first SAR ADC stage 410 performs Q1 sampling, Q2 amplification, Q3 sampling, and Q4 amplification. Thus, in this exemplary embodiment, the multi-stage dual SAR ADC operates with two phases, i.e., sampling and amplification, so that it can realize the same operating speed as a pipeline ADC.

Compared to an existing multi-stage SAR ADC, the multi-stage dual SAR ADC according to an exemplary embodiment of the present invention has improved operating speed even with a shared amplifier in each SAR ADC stage. Compared to the pipeline ADC, it has the same operating speed but reduced chip area and power consumption.

According to the present invention, a multi-stage dual SAR ADC can reduce chip area and power consumption while maintaining an operating speed of tens to hundreds of MHz, similar to that of the pipeline ADC.

Further, two SAR ADCs of the previous SAR ADC stage share a residue amplifier, so that the multi-stage dual SAR ADC can reduce the chip area.

The drawings and specification disclose typical exemplary embodiments of the invention and, although specific terms are employed, they are used in a generic and descriptive sense only and not for purposes of limitation. As for the scope of the invention, it is to be set forth in the following claims. Therefore, it will be understood by those of ordinary skill in the art that various changes in form and details may be made therein without departing from the spirit and scope of the present invention as defined by the following claims.

What is claimed is:

1. A multi-stage dual successive approximation register analog-to-digital converter (SAR ADC), comprising:
   a plurality of SAR ADC stages configured to convert an analog input voltage into a predetermined bit digital signal, each SAR ADC stage being serially connected to one another and including two SAR ADCs; and
   at least one residue amplifier respectively connected between every two successive SAR ADC stages, and configured to amplify residue voltage output from a previous SAR ADC stage to output the amplified residue voltage to a next SAR ADC stage,
   wherein the two SAR ADCs of the previous SAR ADC stage share the residue amplifier.

2. The multi-stage dual SAR ADC of claim 1, wherein the two SAR ADCs operate according to four clock cycles with different phases.

3. The multi-stage dual SAR ADC of claim 2, wherein the two SAR ADCs in each SAR ADC stage are connected in parallel and independently perform analog-to-digital conversion, and respective residue voltages output from the two SAR ADCs are amplified during different clock cycles.

4. The multi-stage dual SAR ADC of claim 3, wherein the two SAR ADCs in each SAR ADC stage perform sampling during first and third clock cycles, and the residue amplifier amplifies the residue voltages output from the two SAR ADCs during second and fourth clock cycles.

5. The multi-stage dual SAR ADC of claim 1, wherein each of the two SAR ADCs in each SAR ADC stage includes:
   a capacitor array generating bit level voltages according to a predetermined bit;

a comparator comparing the analog input voltage with the bit level voltages; and a SAR logic circuit converting the analog input voltage into a predetermined bit digital signal using the comparison result from the comparator.

6. The multi-stage dual SAR ADC of claim 5, wherein the capacitor array includes $2^n$-1 capacitors when the SAR ADC is an n-bit converter, (n being a positive integer).

7. The multi-stage dual SAR ADC of claim 5, wherein the comparator compares the analog input voltage with the bit level voltages and outputs a high- or low-level signal based on the comparison result.

8. The multi-stage dual SAR ADC of claim 1, wherein the multi-stage dual SAR ADC has a digital conversion resolution of the analog input voltage equal to the sum of resolutions of the SAR ADC stages.

9. The multi-stage dual SAR ADC of claim 1, wherein the SAR ADC stages include first, second and third SAR ADC stages and each of the at least one residue amplifier is connected between the first and the second SAR ADC stages and between the second and the third SAR ADC stages.

10. A method of performing analog-to-digital conversion using a multi-stage dual successive approximation register analog-to-digital converter (SAR ADC) including a plurality of SAR ADC stages that are sequentially connected to one another for converting an analog input voltage into a predetermined bit digital signal, each of the SAR ADC stages including two SAR ADCs connected in parallel; and at least one residue amplifier respectively connected between every two successive SAR ADC stages, the method comprising:

independently performing analog-to-digital conversion, by the two SAR ADCs in each SAR ADC stage, during different clock cycles; and amplifying, by the residue amplifier, residue voltages output from the two SAR ADCs after the analog-to-digital conversion.

11. The method of claim 10, wherein the two SAR ADCs operate according to four clock cycles with different phases.

12. The method of claim 11, wherein the performing of the analog-to-digital conversion comprises performing, by each of the two SAR ADCs in each SAR ADC stage, sampling during one clock cycle and the analog-to-digital conversion during two following clock cycles, and wherein, after the first of the two SAR ADCs initiates the sampling, the second initiates the sampling at intervals of two clock cycles.

13. The method of claim 11, wherein the amplifying of the residue voltages comprises amplifying, by the residue amplifier, the residue voltages output from the two SAR ADCs at intervals of two clock cycles.

* * * * *